(12) United States Patent
Jung et al.

(10) Patent No.: US 8,995,208 B2
(45) Date of Patent: Mar. 31, 2015

(54) STATIC RANDOM ACCESS MEMORY DEVICES HAVING READ AND WRITE ASSIST CIRCUITS THEREIN THAT IMPROVE READ AND WRITE RELIABILITY

(75) Inventors: Jonghoon Jung, Hwaseong-si (KR); Sounghoon Sim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 678 days.

(21) Appl. No.: 13/163,346

(22) Filed: Jun. 17, 2011

(65) Prior Publication Data

US 2012/0014172 A1  Jan. 19, 2012

(30) Foreign Application Priority Data

Jul. 16, 2010 (KR) .................. 10-2010-0069002

(51) Int. Cl.
*G11C 7/22* (2006.01)
*G11C 11/413* (2006.01)

(52) U.S. Cl.
CPC .................. *G11C 11/413* (2013.01)
USPC ............ 365/189.16; 365/189.15; 365/189.09; 365/189.11; 365/203; 365/156; 365/154

(58) Field of Classification Search
USPC .......... 365/156, 154, 189.16, 189.15, 189.09, 365/189.11, 203
See application file for complete search history.

(56) References Cited

U.S. PATENT DOCUMENTS

| | | | |
|---|---|---|---|
| 6,205,049 B1 | 3/2001 | Lien et al. | |
| 6,549,453 B2 * | 4/2003 | Wong | 365/156 |
| 6,781,870 B1 | 8/2004 | Kushida | |
| 7,313,032 B2 * | 12/2007 | Ellis et al. | 365/189.09 |
| 7,515,489 B2 | 4/2009 | Wong | |
| 2009/0154274 A1 | 6/2009 | Abu-Rahma et al. | |

OTHER PUBLICATIONS

Yamaoka et al. "Low Power SRAM Menu for SOC Application Using Yin-Yang-Feedback Memory Cell Technology", 2004 Symposium on VLSI Circuits Digest of Technical Papers, pp. 288-291.

* cited by examiner

*Primary Examiner* — Andrew Q Tran
(74) *Attorney, Agent, or Firm* — Myers Bigel Sibley & Sajovec, PA (57) ABSTRACT

Integrated circuit memory devices include a memory cell configured to receive a power supply signal and a write assist circuit. The write assist circuit is configured to improve write margins by reducing a magnitude of the power supply signal supplied to the memory cell from a first voltage level to a lower second voltage level during an operation to write data into the memory cell. The memory device further includes at least one bit line electrically coupled to the memory cell and a read assist circuit. The read assist circuit may be configured to improve read reliability by partially discharging the at least one bit line from an already precharged voltage level to a lower third voltage level in preparation to read data from the memory cell.

22 Claims, 9 Drawing Sheets

STATIC RANDOM ACCESS MEMORY DEVICES HAVING READ AND WRITE ASSIST CIRCUITS THEREIN THAT IMPROVE READ AND WRITE RELIABILITY

REFERENCE TO PRIORITY APPLICATION

This U.S. non-provisional patent application claims priority under 35 U.S.C. §119 to Korean Patent Application No. 10-2010-0069002, filed Jul. 16, 2010, the entirety of which is hereby incorporated herein by reference.

BACKGROUND

Semiconductor memory device are typically classified into volatile memory devices and nonvolatile memory devices. Volatile memory devices lose their stored data when their power supplies are interrupted, while nonvolatile memory devices retain their stored data even when their power supplies are interrupted.

Volatile memory devices include static random access memories (SRAMs) and dynamic random access memories (DRAMs), which are roughly categorized according to data storage schemes. That is, an SRAM stores data by using a latch while a DRAM stores data by using a capacitor. Especially, an SRAM is mainly used as a cache memory because its peripheral circuit is simple in configuration and its speed is high in spite of lower memory capacity resulting from lower integration density than a DRAM.

The miniaturization of semiconductor devices is accelerating with the recent advance in semiconductor manufacturing processes, which involves increase in distribution of basic process characteristics of the semiconductor devices. For example, in an SRAM, miniaturization of semiconductor devices involves increase in distribution of characteristics required for design such as a write margin and a sense margin. As semiconductor manufacturing processes become finer, the increased distribution leads to difficulty in development of SRAMs and reduction in stability of memory cells. As a result, yield is reduced.

SUMMARY OF THE INVENTION

Integrated circuit memory devices according to embodiments of the invention include a memory cell configured to receive a power supply signal (e.g., Vc) and a write assist circuit. This write assist circuit is configured to reduce a magnitude of the power supply signal supplied to the memory cell from a first voltage level to a lower second voltage level during an operation to write data into the memory cell. According to some additional embodiments of the invention, the memory device may also include at least one bit line electrically coupled to the memory cell and a read assist circuit. This read assist circuit may be configured to partially discharge the at least one bit line from an already precharged voltage level to a lower third voltage level in preparation to read data from the memory cell.

According to additional embodiments of the invention, the write assist circuit is further configured to raise the power supply signal from the second voltage level to the first voltage level upon completion of the operation to write data into the memory cell. In addition, the read assist circuit, which may be responsive to a read assist control signal, may be configured to partially discharge the at least one bit line in response to a transition of the read assist control signal between unequal logic states (e.g., from logic 1→0).

According to still further embodiments of the invention, the memory cell is a static random access memory (SRAM) cell containing a pair of PMOS pull-up transistors. The source terminals of the pair of PMOS transistors are configured to receive the power supply signal. This SRAM cell is responsive to a word line signal that is active during the operation to write data into the memory cell. The write assist circuit is also configured to hold the magnitude of the power supply signal at the second voltage level when the word line signal is active during the operation to write data into the memory cell.

According to still further embodiments of the invention, a method of operating a static random access memory (SRAM) cell includes writing data into the SRAM cell by driving a word line of the SRAM cell with an active word line signal concurrently with reducing a voltage of a power supply signal received by the SRAM cell. In addition, to prepare for a reading operation, a pair of differential bit lines coupled to the SRAM cell may be precharged to equivalent precharged voltage levels. Thereafter, data may be read from the SRAM cell by partially discharging the precharged pair of differential bit lines in advance of driving the word line of the SRAM cell with the active word line signal. This reading operation may also include driving the word line of the SRAM cell with the active word line signal concurrently with sensing and amplifying a differential voltage established across the pair of differential bit lines using, for example, a sense amplifier.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

DETAILED DESCRIPTION OF THE EMBODIMENTS

The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and may be exaggerated for clarity. Furthermore, the same reference numerals denote the same elements throughout the specification. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
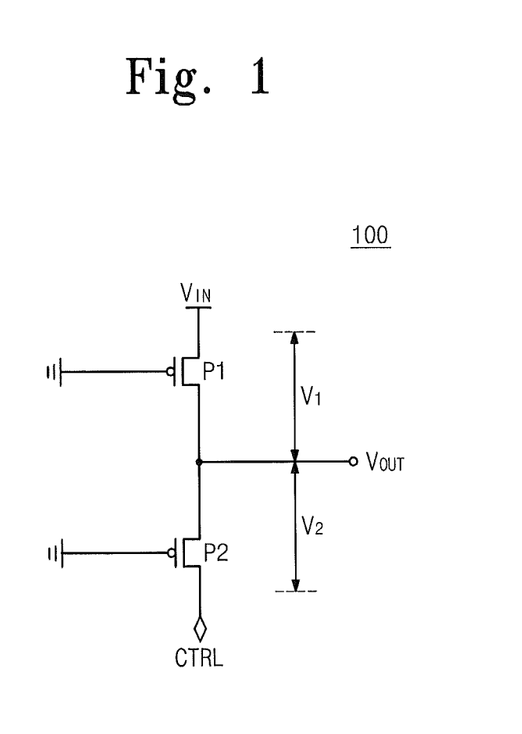
FIG. 1 is a circuit diagram of a power supply circuit according to an example embodiment of the inventive concept.

FIG. 1 is a circuit diagram of a power supply circuit 100 according to an example embodiment of the inventive concept. As illustrated, the power supply circuit 100 includes a first PMOS transistor P1 and a second PMOS transistor P2. The first PMOS transistor P1 is coupled between a voltage input terminal to which an input voltage $V_{IN}$ is applied and a voltage output terminal to which an output voltage $V_{OUT}$ is output. The second PMOS transistor P2 is coupled between a control signal input terminal to which a control signal CTRL is applied and the voltage output terminal from which an output voltage $V_{OUT}$ is output. A ground voltage (or another appropriate reference voltage) may be applied to a gate of each of the first and second PMOS transistors P1 and P2. If necessary, the gates of the first and second PMOS transistors P1 and P2 may be connected to each other and a ground voltage (or another appropriate reference voltage) may be applied to the connected gates.

The power supply circuit 100 according to an example embodiment of the inventive concept includes a multi-purpose PMOS driver. That is, the second PMOS transistor P2 functions as the multi-purpose PMOS driver. The second PMOS transistor P2 may function as either one of a discharger and a precharger according to the control signal CTRL applied to the control signal input terminal. For example, the second PMOS transistor P2 may function as a discharger when a control signal CTRL of logic 'low' level is applied. Meanwhile, the second PMOS transistor P2 may act as a precharger when a control signal CTRL of logic 'high' level is applied.

The output voltage $V_{OUT}$ output from the voltage output terminal of the power supply circuit 100 is controlled according to an operation scheme of the second PMOS transistor P2. For example, as describe above, the second PMOS transistor P2 may function as a discharger when the control signal CTRL of logic 'low' level is applied to the control signal input terminal. In this case, the output voltage $V_{OUT}$ output from the output terminal of the power supply circuit 100 may be output after being reduced by a predetermined voltage by the second PMOS transistor P2. On the other hand, as described above, the second PMOS transistor P2 may function as a precharger when the control signal CTRL of logic 'high' level is applied to the control signal input terminal. In this case, the output voltage $V_{OUT}$ output from the output terminal of the power supply circuit 100 may be generated by not only an input voltage $V_{IN}$ transferred through the first PMOS transistor P1 but also a control signal CTRL transferred through the second PMOS transistor P2.

Figure 2:
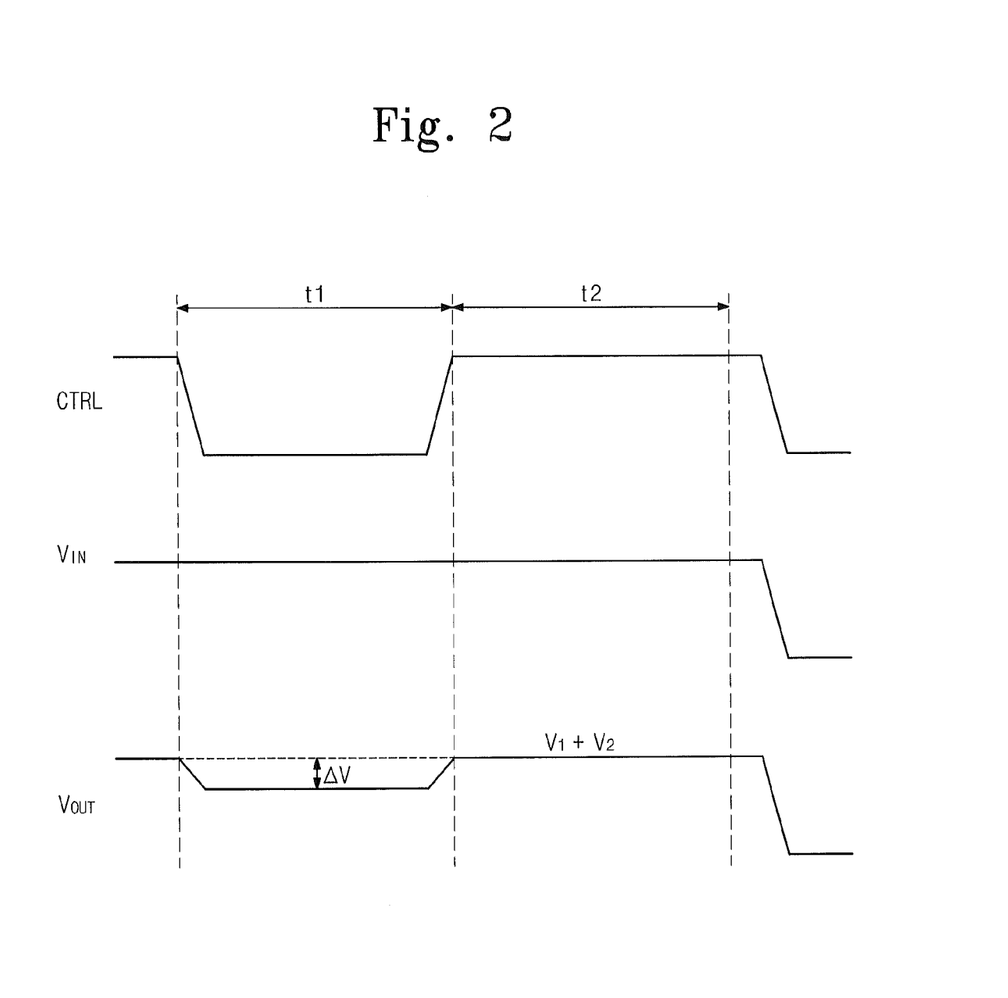
FIG. 2 is a timing diagram illustrating the operation of the power supply circuit shown in FIG. 1.

FIG. 2 is a timing diagram illustrating the operation of the power supply circuit 100 shown in FIG. 1. The operation of the power supply circuit 100 will be described in further detail below with reference to FIGS. 1 and 2. The power supply circuit 100 according to embodiments of the inventive concept includes a first PMOS transistor P1 and a second PMOS transistor P2. Since a ground voltage is applied to a gate of each of the first and second PMOS transistors P1 and P2, the first and second PMOS transistors P1 and P2 may be in a turn-on state. Thus, an output voltage $V_{OUT}$ output from an output terminal of the power supply circuit 100 is controlled according to an input voltage $V_{IN}$ input to a voltage input terminal and a control signal CTRL applied to a control signal input terminal. Hereinafter, the operation of the power supply circuit 100 will be described under the assumption that the input voltage $V_{IN}$ input to the voltage input terminal of the power supply circuit 100 is maintained at a constant voltage level.

Since the input voltage $V_{IN}$ of the power supply circuit 100 is maintained at a constant voltage value, the output voltage $V_{OUT}$ of the power supply circuit 100 is controlled according to the control signal CTRL. As shown at a period "t1" in FIG. 2, the input voltage $V_{IN}$ of the power supply voltage 100 is output to the voltage output terminal through the first PMOS transistor P1 when the control signal CTRL of logic 'low' level is applied to the control signal input terminal. However, the input voltage $V_{IN}$ of the power supply voltage 100 may be output after being reduced by a predetermined voltage level $\Delta V$. The predetermined voltage level $\Delta V$ may be determined according to current driving characteristics (and threshold voltage) of the second PMOS transistor P2. Thus, the second PMOS transistor P2 functions as a discharger configured to reduce the output voltage $V_{OUT}$ of the power supply circuit 100 by the predetermined voltage level $\Delta V$.

Meanwhile, as shown at a period "t2" in FIG. 2, the output voltage $V_{OUT}$ of the power supply voltage 100 is also generated by the input voltage $V_{IN}$ transferred through the first PMOS transistor P1 when the control signal CTRL of a 'high' level is applied. In addition, the output voltage $V_{OUT}$ of the power supply voltage 100 is also generated by the control signal CTRL transferred through the second PMOS transistor P2 when the control signal CTRL of logic 'high' level is applied. That is, the output voltage $V_{OUT}$ of the power supply voltage 100 is generated by a voltage $V_1$ transferred through the first PMOS transistor P1 and a voltage $V_2$ transferred through the second PMOS transistor P2. Thus, the second PMOS transistor P2 functions as a sub-precharger to stabilize the output voltage $V_{OUT}$ of the power supply voltage 100.

Because the second PMOS transistor P2 may function as a sub-precharger, the output voltage $V_{OUT}$ may be stably output even if current driving capability of the first PMOS transistor P1 decreases. This means that a size of the first PMOS transistor P1 may decrease. That is, the size of the first PMOS transistor P1 may decrease because the second PMOS transistor P2 may function as a sub-precharger.

As set forth above, the second PMOS transistor P2 functions as either one of a discharger and a precharger according to the control signal CTRL applied to the control signal input terminal. Therefore, the second PMOS transistor P2 functions as a multi-purpose PMOS transistor having two purposes of a discharger and a precharger. The output voltage $V_{OUT}$ output from the voltage output terminal of the power supply circuit 100 is controlled according to an operation scheme of the second PMOS transistor P2.

According to embodiments of the inventive concept, a ground voltage is commonly applied to a gate of each of the first and second PMOS transistors P1 and P2 of the power supply circuit 100. Moreover, the second PMOS transistor P2 functions as either one of a discharger and a precharger according to a control signal applied to a control signal input terminal. However, it will be understood that an output voltage $V_{OUT}$ output from a voltage output terminal may be controlled according to a gate voltage applied to a gate of each of the first and second PMOS transistors P1 and P2 and a control signal applied to a control signal input terminal of the second PMOS transistor P2.

Figure 3:
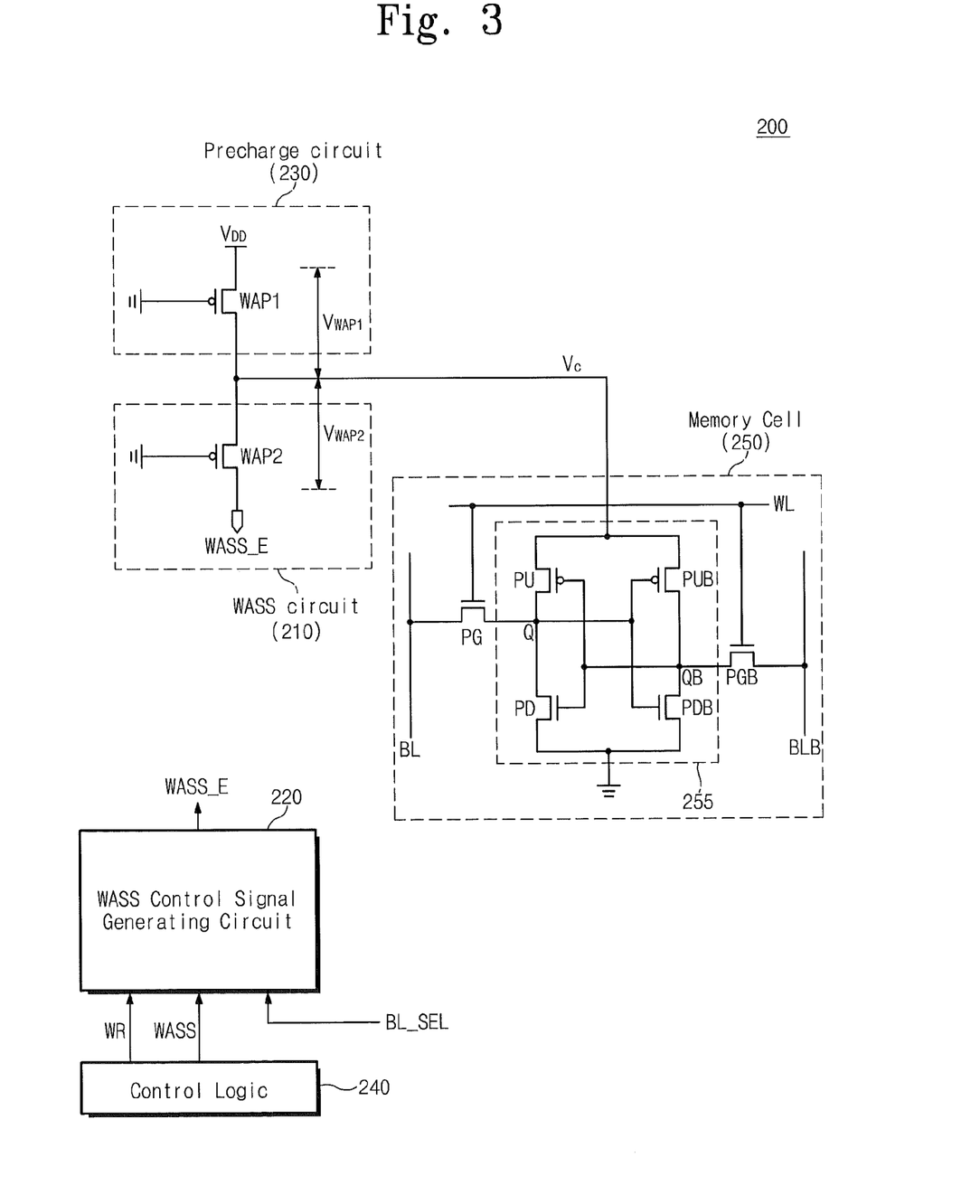
FIG. 3 is a circuit diagram of a static random access memory device including a write assist circuit according to an example embodiment of the inventive concept.

FIG. 3 is a circuit diagram of a static random access memory device 200 including a write assist circuit according to an example embodiment of the inventive concept. Referring to FIG. 3, the static random access memory device 200 includes a write assist (WASS) circuit 210, a WASS control signal generating circuit 220, a precharge circuit 230, a control logic 240, and a memory cell 250. The static random access memory device 200 stores data by using a latch-type memory cell 250 including six transistors. That is, the memory cell 250 may be a full-CMOS type SRAM cell including two pull-up transistors PU and PUB, two pull-down transistors PD and PDB, and two pass transistors PG and PGB. However, it will be understood that the memory cell 250 is not limited to a latch-type memory cell 250 including six transistors. For example, the memory cell 250 may be a high load resistor (LHR) type memory cell or a thin film transistor (TFT) type memory cell according to elements constituting pull-up transistors.

The memory cell 250 is connected to a wordline WL and a bitline pair (BL and BLB) that is a data input/output path. The memory cell 250 includes a first pass transistor PG, a second pass transistor PGB, and a latch circuit 255. A gate of the first pass transistor PG is connected to the wordline WL and a first terminal thereof is connected to a bitline BL. The first pass transistor PG connects a bitline BL and a first data storage node Q to each other when the wordline WL is activated to a logic 'high' level. A gate of the second pass transistor PGB is connected to the wordline WL and a first terminal thereof is connected to the bitline BLB. The second pass transistor PGB connects the bitline BLB and a second data storage node QB to each other when the wordline WL is activated to a logic 'high' level. The latch circuit 255 is coupled between the first pass transistor PG and the second pass transistor PGB and stores data.

The latch circuit 255 storing data includes a first pull-up transistor PU, a second pull-up transistor PUB, a first pull-down transistor PD, and a second pull-down transistor PDB. A first terminal of the first pull-up transistor PU is applied with a power supply voltage $V_C$ of a memory cell and a second terminal thereof is connected to a second terminal of the first pass transistor PG. A first terminal of the first pull-down transistor PD is connected to a second terminal of the first pass transistor PG and a second terminal thereof is applied with a ground voltage. The first pull-up transistor PU and the first pull-down transistor PD are each controlled by a signal of the second data storage node QB to supply the power supply voltage $V_C$ or the ground voltage to the first data storage node Q. A first terminal of the second pull-up transistor PUB is applied with a power supply voltage $V_C$ of a memory cell and a second terminal thereof is connected to a second terminal of the second pass transistor PGB. A first terminal of the second pull-down transistor PGB is connected to a second terminal of the second pass transistor PGB and a second terminal thereof is applied with a ground voltage. The second pull-up transistor PUB and the second pull-down transistor PDB are each controlled by a signal of the first data storage node Q to supply the power supply voltage or the ground voltage $V_C$ to the second data storage node QB.

The amount of current flowing through the first and second pull-up transistors PU and PUB is necessarily reduced to improve a write margin of the memory cell 250. The amount of current flowing through the first and second pull-up transistors PU and PUB is controlled by a power supply voltage level $V_C$ of a memory cell. That is, according to the embodiment of the inventive concept, the power supply voltage level $V_C$ of a memory cell is controlled by the write assist circuit 210 such that the memory cell 250 operates stably during a write operation. For example, the write assist circuit 210 may lower the power supply voltage level $V_C$ of a memory cell. The precharge circuit 230 precharges a power supply voltage supply terminal of the memory cell 250. The precharge circuit 230 includes a first PMOS transistor WAP1, which is coupled between a power supply voltage ($V_{DD}$) input terminal and a power supply voltage ($V_C$) supply terminal of a memory cell. A gate of the first PMOS transistor WAP1 is applied with a ground voltage. The write assist circuit 210 includes a second PMOS transistor WAP2, which is coupled between the power supply voltage ($V_C$) supply terminal of a memory cell and a write assist control signal (WASS_E) input terminal. Similar to the first PMOS transistor WAP1, a gate of the second PMOS transistor WAP2 is applied with a ground voltage. The second PMOS transistor WAP2 may function as either one of a discharger and a precharger according to the control signal WASS_E applied to a write assist control signal (WASS_E) input terminal. For example, the second PMOS transistor WAP2 may function as a discharger when the control signal WASS_E of logic 'low' level is applied. Meanwhile, the second PMOS transistor WAP2 may function as a precharger when the control signal WASS_E of logic 'high' level is applied. This operation of the second PMOS transistor WAP2 will be described below in detail with reference to FIG. 4.

Figure 4:
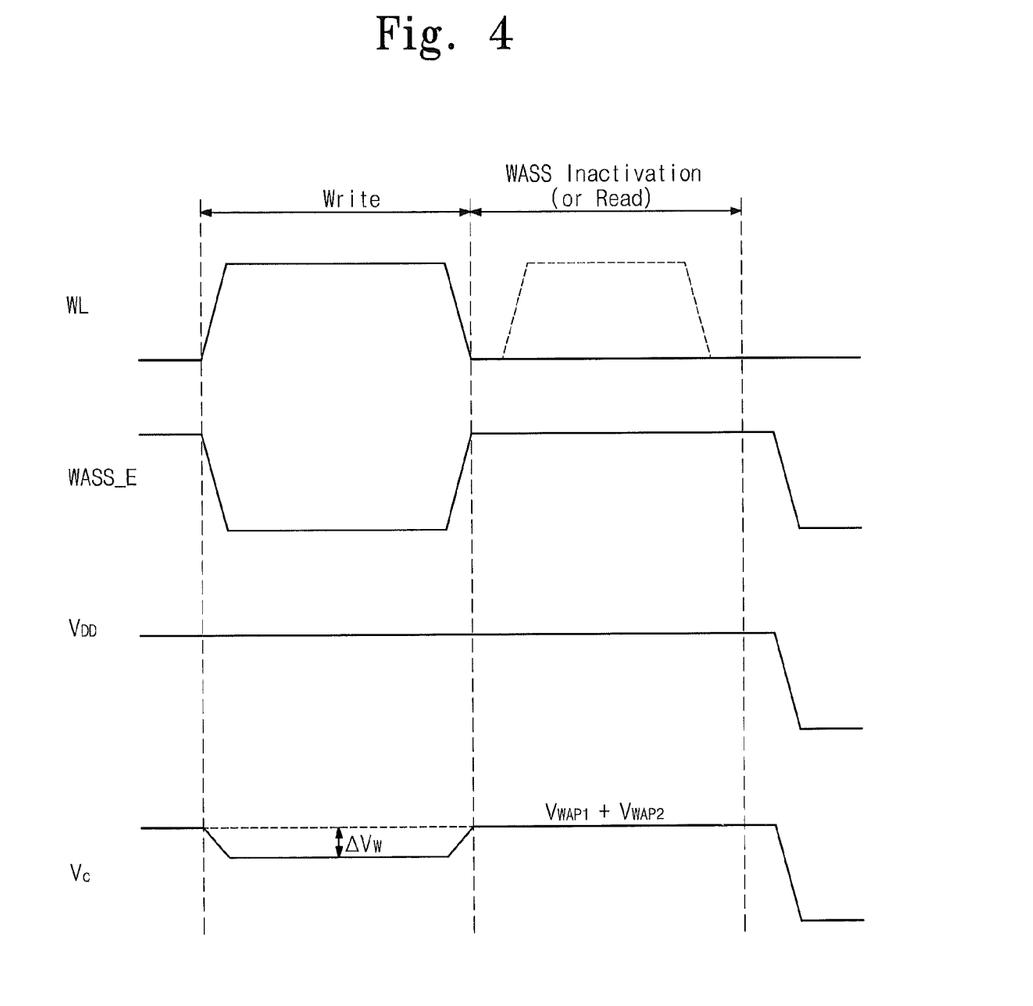
FIG. 4 is a timing diagram illustrating the operation of the write assist circuit shown in FIG. 3.

FIG. 4 is a timing diagram illustrating the operation of the write assist circuit shown in FIG. 3. Referring to FIGS. 3 and 4, the first and second PMOS transistors WAP1 and WAP2 are in a turn-on state because their gates are each applied with a ground voltage. Thus, the power supply voltage $V_C$ of the memory cell 250 is controlled according to a power supply voltage $V_{DD}$ input to a power supply voltage ($V_{DD}$) input terminal of the precharge circuit 230 and a write assist control signal WASS_E input to a write assist control signal (WASS_E) input terminal of the write assist circuit 210. Hereinafter, the operation of the write assist circuit 210 will be described below under the assumption that the power supply voltage $V_{DD}$ is maintained at a constant voltage level.

The power supply voltage $V_C$ of the memory cell 250 is controlled according to the write assist control signal WASS_E because the power supply voltage $V_{DD}$ input to the power supply voltage ($V_{DD}$) input terminal of the precharge circuit 230 is maintained at a constant voltage level. For a write operation period in which a wordline WL is activated to a logic 'high' level, the power supply voltage supply terminal of the memory cell 250 is precharged to the power supply voltage $V_{DD}$ by the first PMOS transistor WAP1. At the same time, the control logic 240 activates the write assist control signal WASS_E. When the write assist control signal WASS_E is activated (e.g., the write assist control signal WASS_E of logic 'low' level is applied to the write assist control signal), the second PMOS transistor WAP2 functions as a discharger. A part of the current flowing through the first PMOS transistor WAP1 flows through the second PMOS transistor WAP2 remaining in a turn-on state after being divided. Thus, the power supply voltage $V_C$ decreases by a predetermined voltage level $\Delta V_W$ due to the second PMOS transistor WAP2.

The decreased amount $\Delta V_W$ of the power supply voltage $V_C$ of a memory cell may be determined according to current driving capability of the first and second PMOS transistors WAP1 and WAP2. For example, assuming that the current driving capability of the first PMOS transistors WAP1 is constant, the decreased amount $\Delta V_W$ of the power supply voltage $V_C$ of a memory cell may increase as the current driving capability of the second PMOS transistor WAP2 becomes greater (e.g., the second PMOS transistor WAP2 increases in width and decreases in length).

According to the embodiment of the inventive concept, the second PMOS transistor WAP2 controls a power supply voltage level $V_C$ of a memory cell to be lower than a power supply voltage level $V_{DD}$ during a write operation. Thus, the static random access memory device 200 according to the embodiment of the inventive concept may lower the power supply voltage level $V_C$ of a memory cell by using the second PMOS transistor WAP2 in spite of the use of a single power supply. Since the amount of current flowing through the first and second pull-up transistors PU and PUB decreases according to the lowered power supply voltage level $V_C$ of a memory cell, a write margin of the memory cell may be improved.

For a period in which the write assist circuit 210 is inactivated (e.g., write operation and a standby operation), the control logic 240 inactivates the write assist control signal WASS_E. When the write assist control signal WASS_E is inactivated (e.g., a write assist control signal WASS_E of logic 'high' level is applied to a write assist control signal input terminal), the second PMOS transistor WAP2 functions as a precharger. The power supply voltage supply terminal of the memory cell 250 is precharged by a voltage $V_{WAP1}$ generated by current flowing through the first PMOS transistor WAP1 and a voltage $V_{WAP2}$ generated by current flowing through the second PMOS transistor WAP2. That is, the internal voltage level $V_C$ of the memory cell 250 is maintained at the power supply voltage level $V_{DD}$ by the first and second PMOS transistors WAP1 and WAP2.

Since the second PMOS transistor WAP2 functions as a sub-precharger, the power supply voltage level $V_C$ of the memory cell 250 is stably maintained at the power supply voltage level $V_{DD}$. That is, the power supply voltage level $V_C$ of the memory cell 250 may be stably maintained by the second PMOS transistor WAP2 even if the current driving capability of the first PMOS transistor WAP decreases. As the second PMOS transistor WAP is used, the size of the first PMOS transistor WAP1 may decrease. For the brevity of description, the memory cell 250 and the write assist circuit 210 connected to one bitline pair have been exemplarily described in FIG. 3. However, the static random access memory device 200 shown in FIG. 3 may include a plurality of memory cells connected to a plurality of bitline pairs. Moreover, a write assist circuit may be configured at the respective bitline pairs. The bitline pairs are controlled by a column address for selecting a memory cell. For example, a memory cell to read data during a read operation or a memory cell in which data is to be stored is controlled by a corresponding bitline according to the column address. In addition, as set forth above, the assist circuit is activated during a write operation and inactivated during a read operation and a standby operation.

Accordingly, the control logic 240 applies a write operation signal WR and a write assist operation signal WASS to the WASS control signal generating circuit 220 to activate a write assist circuit only during a write operation. In addition, a bitline selection signal BL_SEL depending on a column address is applied to the WASS control signal generating circuit 220 to activate only a write assist circuit connected to a selected memory cell where a write operation is performed.

When the write operation signal WR, the write assist operation signal WASS, and the bitline selection signal BL_SEL are activated, the WASS control signal generating circuit 220 outputs the write assist control signal WASS_E to operate the corresponding write assist circuit. As a result, during a write operation, only the assist circuit connected to a memory cell where the write operation is performed is activated while a write assist circuit connected to an unselected memory cell is inactivated.

Figure 5:
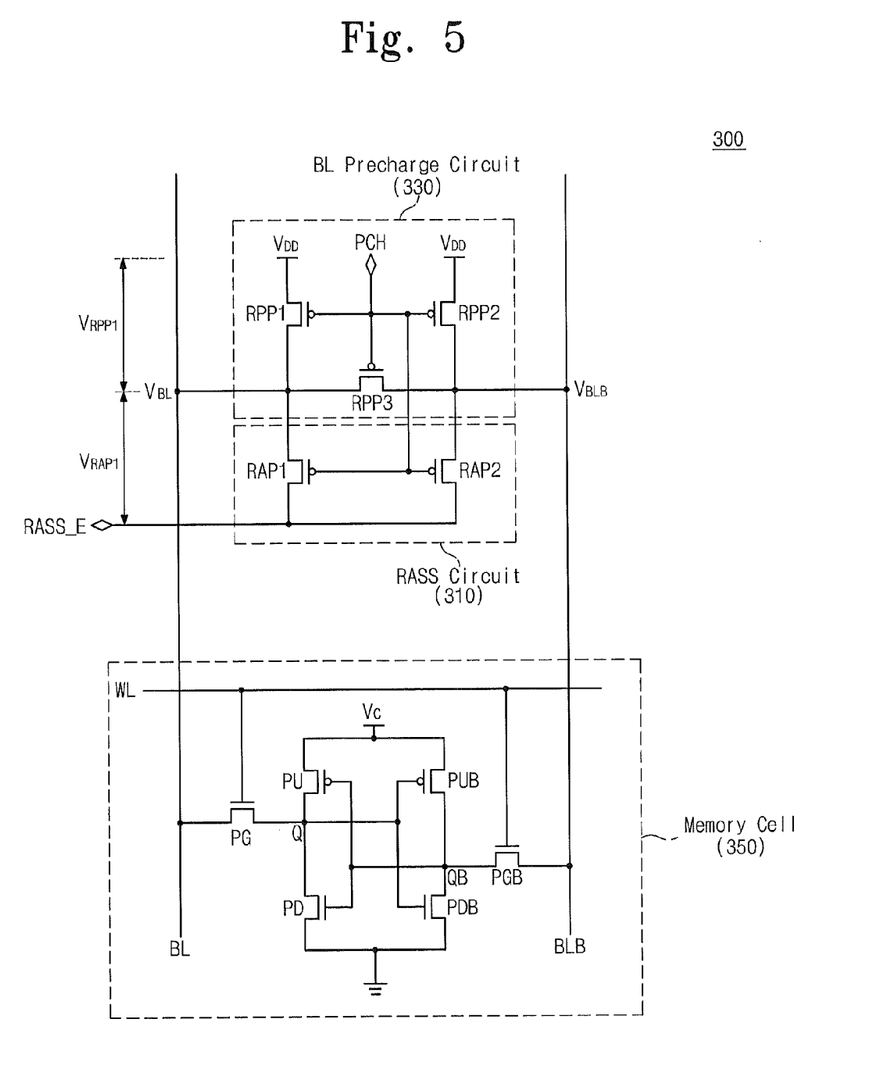
FIG. 5 is a circuit diagram of a static random access memory device including a read assist circuit according to another example embodiment of the inventive concept.

FIG. 5 is a circuit diagram of a static random access memory device 300 including a read assist circuit according to another example embodiment of the inventive concept. As illustrated, the static random access memory device 300 includes a read assist circuit 310, a bitline precharge circuit 330, and a memory cell 350. The configuration and operation of the memory cell 350 are identical to those described in FIG. 3 and will not be described in further detail. The bitline precharge circuit 330 includes a first PMOS transistor RPP1, a second PMOS transistor RPP2, and a third PMOS transistor RPP3. The bitline precharge circuit 330 is coupled between a bitline pair (BL and BLB) and a power supply voltage $V_{DD}$ input terminal to which a power supply voltage $V_{DD}$ is applied. That is, a precharge control signal PCH is applied to a gate terminal of each of the first and second PMOS transistors RPP1 and RPP2. A first terminal of the first PMOS transistor RPP1 is applied with the power supply voltage ($V_{DD}$) and a second terminal thereof is connected to the bitline BLB. The precharge control signal PCH is applied to a gate of the third PMOS transistor RPP3. A first terminal of the third PMOS transistor RPP3 is connected to the bitline BL and a second terminal thereof is connected to the bitline BLB.

The first PMOS transistor RPP1 precharges the bitline BL to a predetermined voltage level (e.g., power supply voltage level $V_{DD}$) in response to the precharge control signal PCH. The second PMOS transistor RPP2 precharges the bitline BLB to a predetermined voltage level (e.g., power supply voltage level $V_{DD}$) in response to the precharge control signal PCH. The third PMOS transistor RPP3 connects the bitline BL and the bitline BLB to each other in response to the precharge control signal PCH. That is, the third PMOS transistor RPP3 makes the bitline BL and the bitline BLB maintained at the same voltage level when it is turned on by the precharge control signal PCH.

The read assist circuit 310 includes a first PMOS transistor RAP1 and a second PMOS transistor RAP2. A control signal PCH is applied to a gate of each of the first and second PMOS transistors RAP1 and RAP2. A first terminal of the first PMOS transistor RAP1 is connected to a second terminal of the first PMOS transistor RPP1 and the bitline BL. A first terminal of the second PMOS transistor RAP2 is connected to a second terminal of the second PMOS transistor RPP2 of the bitline precharge circuit 330 and the bitline BLB. A read assist control signal RASS_E is applied to the second terminal of each of the first and second PMOS transistors RAP1 and RAP2.

The amount of current flowing through the first pass transistor PG and the second pass transistor PGB is necessarily reduced to improve a read margin of the memory cell 350. The amount of current flowing through the first pass transistor PG may be controlled by the level of a precharge voltage to precharge the bitline BLB. That is, when the precharge voltage level at which the bitline BL and the bitline BLB are precharged decreases, the amount of current flowing through the first pass transistor PG and the second pass transistor PGB may also decrease.

According to the embodiment of the inventive concept, during a read operation in which data is read from the memory cell 350, the precharge voltage levels of the bitline BL and the bitline BL are controlled by the read assist circuit 310 to stably operate the memory cell 350. For example, the read assist circuit 310 may decrease the precharge voltage levels of the bitline BL and the bitline BLB.

The first and second PMOS transistors RAP1 and RAP2 of the read assist circuit 310 may function as either one of a discharger and a precharger according to the control signal RASS_E applied to a read assist control signal (RASS_E) input terminal. For example, the first and second PMOS transistors RAP1 and RAP2 may function as a discharger when the control signal RASS_E of logic 'low' level is applied. Meanwhile, the first and second PMOS transistors RAP1 and RAP2 may function as a precharger when the control signal RASS_E of logic 'high' level is applied. This operation of the first second PMOS transistors RAP1 and RAP2 will be described below in detail with reference to FIG. 6.

Figure 6:
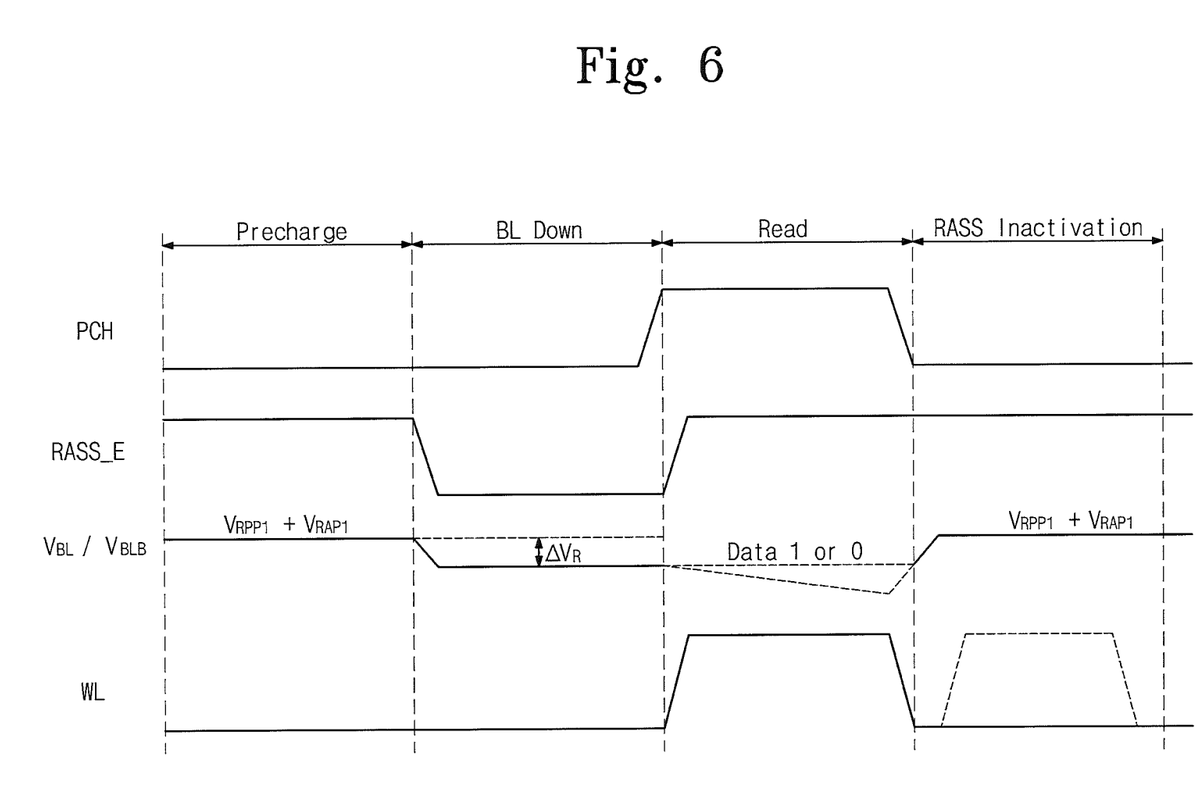
FIG. 6 is a timing diagram illustrating the operation of the read assist circuit shown in FIG. 5.

FIG. 6 is a timing diagram illustrating the operation of the read assist circuit 310 shown in FIG. 5. Referring to FIGS. 5 and 6, during a read operation, a control logic (not shown) of the static random access memory device 300 activates the precharge control signal for a precharge period of the bitline pair (BL and BLB). When the precharge control signal PCH is activated (e.g., the precharge signal PCH of logic 'low' level is applied to a signal input terminal, all the transistors RPP1~RPP3 of the bitline precharge circuit 330 and all the transistors RAP1 and RAP2 of the write assist circuit 310 are turned on. The control logic (not shown) inactivates the read assist control signal RASS_E for the precharge period of the bitline pair (BL and BLB). The read assist control signal RASS_E may be an inverted version of a read control signal generated by the control logic (not shown) during a read operation. When the read assist control signal RASS_E is inactivated (e.g., the read assist control signal RASS_E of logic 'high' level is applied to a read assist control signal input terminal), the first and second PMOS transistors RAP1 and RAP2 of the read assist circuit 310 function as a precharger.

The bitline BL is precharged by a voltage $V_{RPP1}$ generated by current flowing through the first PMOS transistor RPP1 of the bitline precharge circuit 330 and a voltage $V_{RAP1}$ generated by current flowing through the first PMOS transistor RAP1 of the read assist circuit 310. The bitline BLB is precharged by a voltage generated by current flowing through the second PMOS transistor RPP2 of the bitline precharge circuit 330 and a voltage generated by current flowing through the second PMOS transistor RAP2 of the read assist circuit 310.

Since the bitline BL and the bitline BLB are identical in precharge voltage level, the voltage $V_{RPP1}$ generated by current flowing through the first PMOS transistor RPP1 of the bitline precharge circuit 330 may be identical to the voltage generated by current flowing through the second PMOS transistor RPP2 of the bitline precharge circuit 330. In addition, the voltage $V_{RAP1}$ generated by current flowing through the first PMOS transistor RAP1 of the read assist circuit 310 may be identical to the voltage generated by current flowing through the second PMOS transistor RAP2 of the read assist circuit 310. Therefore, for the brevity of description, the operation of the first PMOS transistor RPP1 of the bitline precharge circuit 330 and the operation of the first PMOS transistor RAP1 of the read assist circuit 310 will be described hereinafter.

Since The first PMOS transistor RAP1 of the read assist circuit 310 function as a sub-precharger, a bitline voltage level $V_{BL}$ is stably maintained. That is, the bitline voltage $V_{BL}$ may be stably maintained by the first PMOS transistor RAP1 of the read assist circuit 310 even if the current driving capability of the first PMOS transistor RPP1 of the bitline precharge circuit 330 decreases. Thus, the dimension of the first PMOS transistor RPP1 of the bitline precharge circuit 330 may be reduced by the first PMOS transistor RAP1 of the read assist circuit 310.

The control logic (not shown) of the static random access memory device 300 performs an operation of decreasing a bitline voltage before activating a wordline WL to read data of the memory cell 350. Since the precharge control signal PCH is activated in advance, the first PMOS transistor RPP1 of the bitline precharge circuit 330 and the first PMOS transistor RAP1 of the read assist circuit 310 may be in a turn-on state. Thus, a precharge voltage level $V_{BL}$ of the bitline BL is controlled according to the power supply voltage $V_{DD}$ input to the power supply voltage ($V_{DD}$) input terminal of the bitline precharge circuit 330 and the read assist control signal WASS_E applied to the read assist control signal (WASS_E) input terminal of the read assist circuit 310. Hereinafter, the operation of the read assist circuit 310 will be described under the assumption that the power supply voltage $V_{DD}$ is maintained at a constant voltage level.

Since the power supply voltage $V_{DD}$ input to the power supply voltage ($V_{DD}$) input terminal of the bitline precharge circuit 330 is maintained at a constant voltage level, the precharge voltage level $V_{BL}$ of the bitline BL is controlled according to the read assist control signal RASS_E. When the read assist control signal RASS_E is activated (e.g., the read assist control signal RASS_E of logic 'low' level is applied to the read assist control signal input terminal), the first PMOS transistor RAP1 of the read assist circuit 310 functions as a discharger. A part of the current flowing through the first PMOS transistor RPP1 of the bitline precharge circuit 330 flows through the first PMOS transistor RAP1 of the read assist circuit 310 remaining in a turn-on state after being divided. Thus, the bitline voltage level $V_{BL}$ decreases by a predetermined voltage level $\Delta V_R$ due to the first PMOS transistor RAP1 of the read assist circuit 310.

The decreased amount $\Delta V_R$ of the bitline voltage level $V_{BL}$ may be determined by the current driving capability of the first PMOS transistor RPP1 of the bitline precharge circuit 330 and the first PMOS transistor RAP1 of the read assist circuit 310. For example, assuming that the current driving capability of the first PMOS transistor RPP1 of the bitline precharge circuit 330 is constant, the decreased amount $\Delta V_R$ of the bitline voltage level $V_{BL}$ may increase as the current driving capability of the first PMOS transistor RAP1 of the read assist circuit 310 becomes greater (e.g., the first PMOS transistor RAP1 increases in width and decreases in length).

According to the embodiment of the inventive concept, during a read operation, the read assist circuit 310 controls the precharge circuit 330 to lower the precharge voltage precharging the bitline pair (BL and BLB). Thus, the static random access memory device 300 according to the embodiment of the inventive concept may decrease a precharge voltage of a bitline by using the first and second PMOS transistors RAP1 and RAP2 in spite of the use of a single power. Since the amount of current flowing through the first and second pass transistors PG and PGB decreases according to the decreased precharge voltage of a bitline, a read margin of the memory cell 350 may be improved.

For a period in which the read assist circuit 310 is inactivated (e.g., a write operation and a standby operation), the control logic (not shown) of the static random access memory device 300 inactivates the read assist control circuit RASS_E. When the read assist control signal RASS_E is inactivated (e.g., the read assist control signal RASS_E of logic 'high' level is applied to the read assist control signal input terminal), the first and second PMOS transistors RAP1 and RAP2 of the read assist circuit 310 operates the same as for a precharge period a read operation. That is, for the period in which the read assist circuit 310 is inactivated (e.g., a write operation or a standby operation), the first and second PMOS transistors RAP1 and RAP2 of the read assist circuit 310 function as a precharger.

Figure 7:
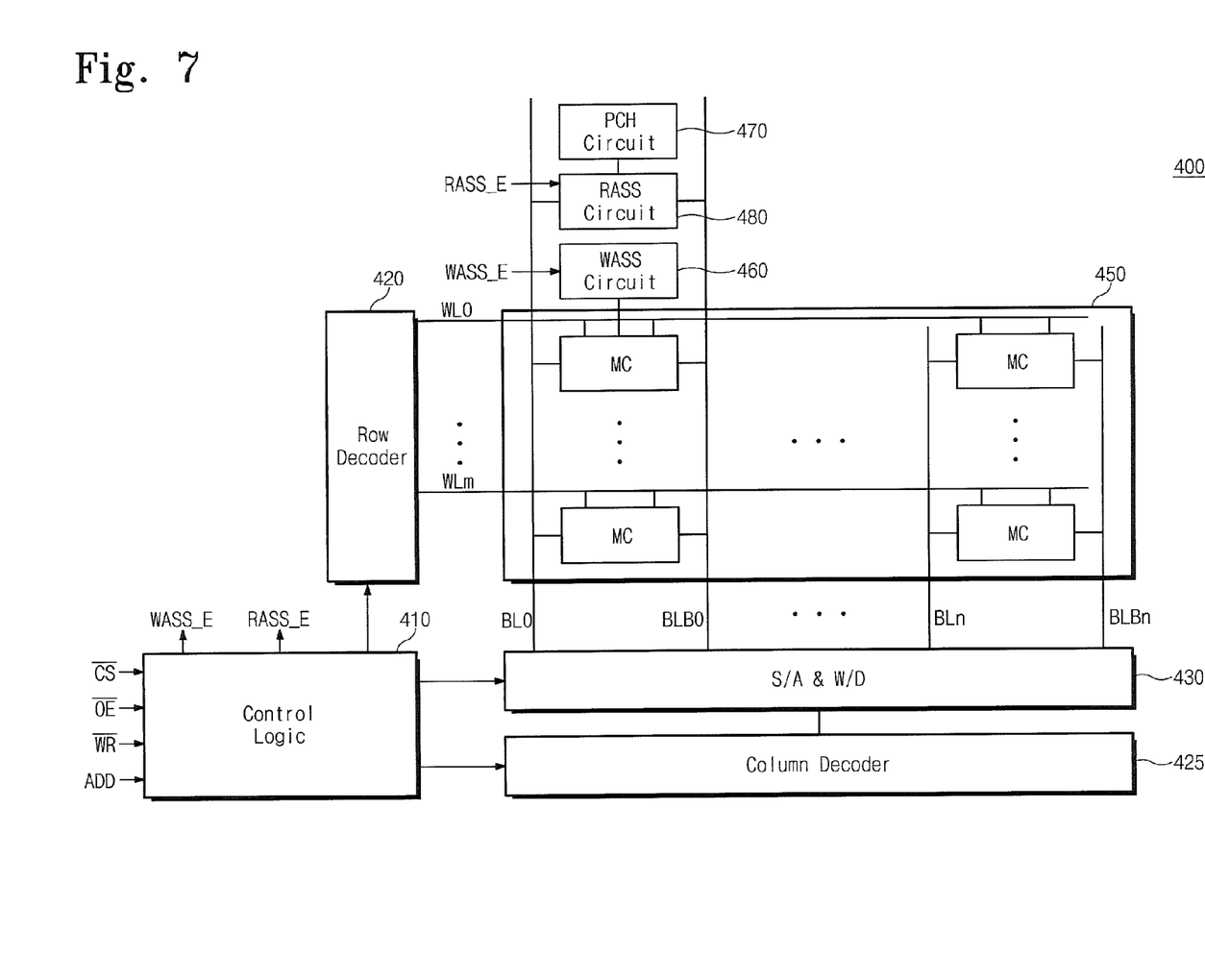
FIG. 7 is a block diagram of a static random access memory device including a read assist circuit and a write assist circuit according to an example embodiment of the inventive concept.

FIG. 7 is a block diagram of a static random access memory device 400 including a read assist circuit and a write assist circuit according to an example embodiment of the inventive concept. As illustrated, the static random access memory device 400 includes a control logic 410, a row decoder 420, a column decoder 425, a sense amplifier and write driver 430, a memory cell array 450, a write assist circuit 460, a bitline precharge circuit 470, and read assist circuit 480. The control logic 410 controls an overall operation of the static random access memory device 400 in response to control signals /CS, /OE, and /WE and an address ADD of an external device (e.g., a host, a memory controller or a memory interface). For example, the control logic 410 controls read and write operations of the static random access memory device 400. Moreover, the control logic 410 controls the write assist circuit 460 to be activated during the write operation. In addition, the control logic 410 controls the read assist circuit 480 to be activated during the read operation.

The row decoder 420 selects one of a plurality of wordlines WL0~WLm in response to a row address. The column decoder 425 selects one of a plurality of bitline pairs BL0~BLn and BLB0~BLBn in response to a column address. The sense amplifier and write driver 430 outputs and receives data through a data input/output buffer (not shown). The sense amplifier 430 amplifies a difference in voltage between bitlines connected to a selected one of a plurality of memory cells to read data stored in the selected memory cell. The read data is output to an external entity of the static random access memory device 400 through the data input/output buffer. The write driver 430 programs data input to the selected memory cell through the data input/output buffer. Such as operation of the sense amplifier and write driver 430 is performed according to the control of the control logic 410.

The memory cell array 450 includes a plurality of cells for storing data. The memory cells are connected to each of the wordlines WL0~WLm and are each coupled between the bitlines BL0~BLn and the bitlines BLB0~BLBn. During a write operation, the write assist circuit 460 is activated according to a control signal WASS_E of the control logic 410 to decrease a power supply voltage level of a memory cell. During the write operation, the read assist circuit 480 is inactivated according to the control signal WASS_E of the control logic 410 to stably precharge a selected bitline pair. Meanwhile, during a write operation, the write assist circuit 460 is inactivated according to the control signal WASS_E of the control logic 410 to stably precharge an internal voltage level of a memory cell. During the write operation, the read assist circuit is activated according to the control signal WASS_E of the control logic 410 to decrease a precharge voltage precharging a bitline pair. Although not shown in the figure, it will be understood that the write assist circuit 460 and the read assist circuit 480 is connected to the respective bitlines pairs BL0~BLn and BLB0~BLBn.

Figure 8:
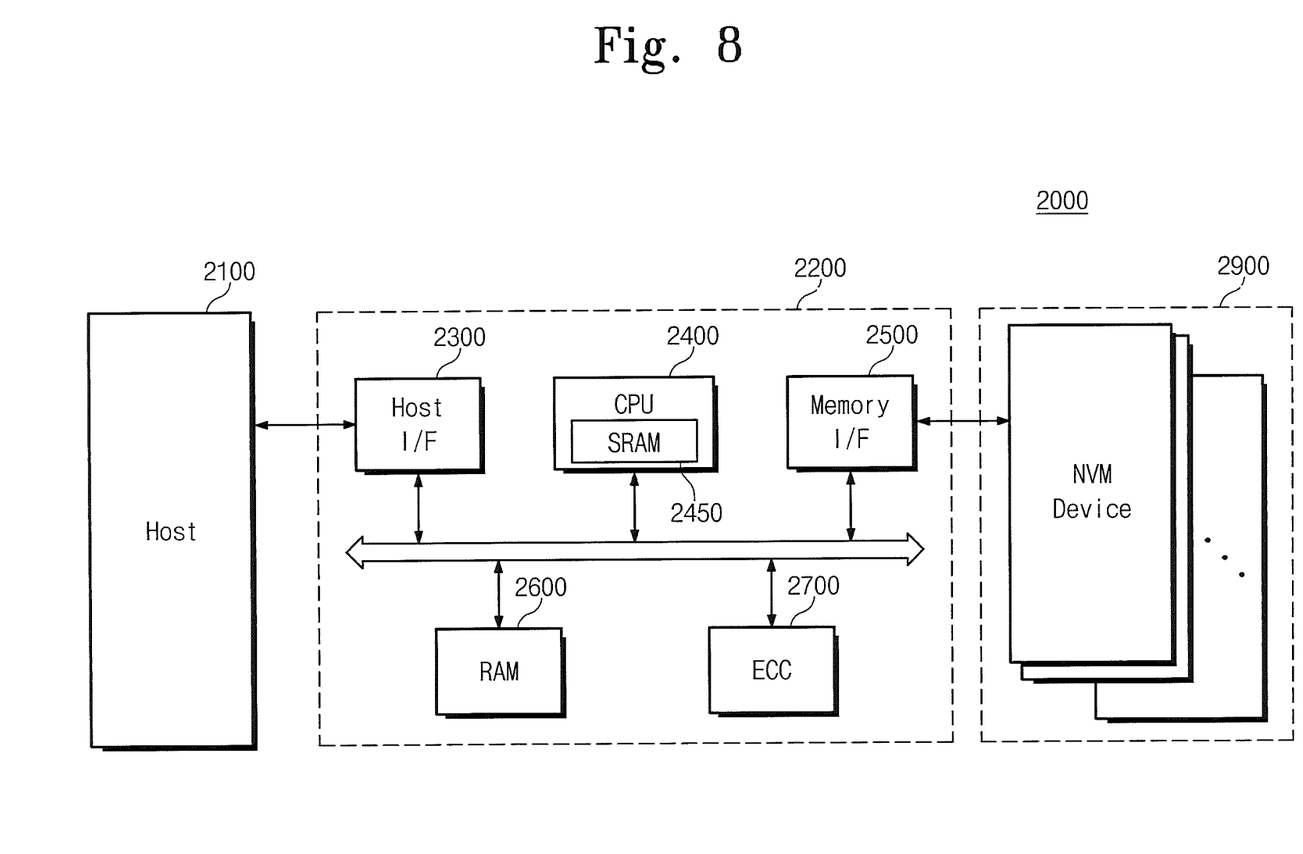
FIG. 8 is a block diagram of a user device including a static random access memory device according to an example embodiment of the inventive concept.

FIG. 8 is a block diagram of a user device 2000 including a static random access memory device according to an example embodiment of the inventive concept. As illustrated, the user device 2000 includes a memory controller 2200 and a nonvolatile memory device. The user device 2000 includes a plurality of nonvolatile memory devices 2900. The memory controller 2200 is connected to a host 2100 and the nonvolatile memory devices 2900. The memory controller 2200 is configured to access the nonvolatile memory devices 2900 in response to a request from the host 2100. For example, the memory controller 2200 is configured to control read, write, and erase operations of the nonvolatile memory devices 2900. The memory controller 2200 is configured to provide an interface between the nonvolatile memory devices 2900 and the host 2100. The memory controller 2200 is configured to drive a firmware for controlling the nonvolatile memory devices 2900.

The memory controller 2200 includes well-known elements such as a random access memory (RAM), a central processing unit (CPU), a host interface, an error connection code block (ECC), and a memory interface. The CPU 2400 may include a random access memory device 2450 according an embodiment of the inventive concept. The RAM 2600 may be used as a working memory of the CPU 2400. The static random access memory device 2450 may be used as a cache memory of the CPU 2400. The CPU 2400 controls an overall operation of the memory controller 2200. The host interface 2300 may include a protocol for data exchange between the host 2100 and the memory controller 2200. For example, the memory controller 2200 may be configured to communicate with an external entity (e.g., host) through one of various types of protocols such as USB(Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, SCSI (Small Computer Small Interface) protocol, ESDI (Enhanced Small Disk Interface) protocol, and IDE (Integrated Drive Electronics) protocol.

An error correction code block (ECC) 2700 may be configured to detect an error of data read from the nonvolatile memory devices 2900 and correct the detected error. The ECC 2700 may be provided as an element of the memory controller 2200. Alternatively, the ECC 2700 may be provided as an element of each of the nonvolatile memory devices 2900. The memory interface 2500 may provide interfacing between the nonvolatile memory devices 2900 and the memory controller 2200.

It will be understood that elements of the memory controller 2200 are not limited to the foregoing elements. For example, the memory controller 2200 may further include a read only memory (ROM) storing code data required for an initial booting operation and data for interfacing with the host 2100.

The memory controller 2200 and the nonvolatile memory devices 2900 may be integrated into one semiconductor device to constitute a memory card. For example, the memory controller 2200 and the nonvolatile memory devices 2900 may be integrated into one semiconductor device to constitute a personal computer memory card international association (PCMCIA) card, a compact flash (CF) card, a smart media card, a memory stick, a multimedia card (e.g., MMC, RS-MMC, and MMC-micro), a secure digital (SD) card (e.g., SD, Mini-SD, Micro-SD, and SDHC) or a universal flash storage (UFS).

As another example, the memory controller 2200 and the nonvolatile memory devices 2900 may be applied to solid state drives (SSDs), computers, portable computers, laptop computers, ultra mobile personal computers (UMPCs), netbooks, personal digital assistants (PDAs), web tablets, wireless phones, mobile phones, smart phones, digital cameras, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, one of various components constituting a computing system, radio frequency identification (RFID) devices or embedded systems.

The CPU 2400 of the user device 2000 may include a static random access memory device 2450 according to the embodiment of the inventive concept shown in FIG. 7. In the static random access memory device 2450, during a write operation, a power supply terminal of a memory cell may be discharged by a write assist circuit and a bitline may be precharged by a read assist. Thus, a write margin of the memory cell may be improved. During a read operation, the power supply terminal of the memory cell may be precharged by the write assist circuit and a selected bitline may be discharged by the read assist circuit. Thus, a read margin of the memory cell may be improved.

Figure 9:
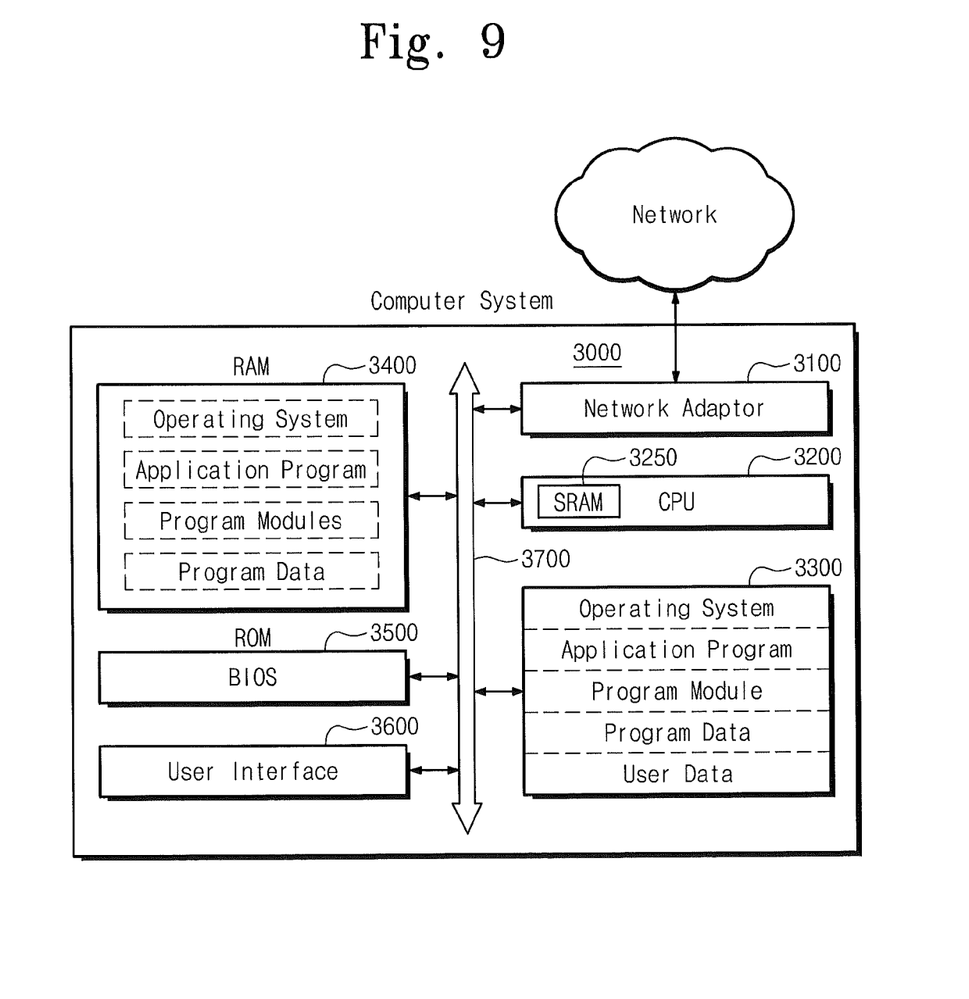
FIG. 9 is a block diagram of a computer system including a static random access memory device according to an example embodiment of the inventive concept.

FIG. 9 is a block diagram of a computer system 3000 including a static random access memory device according to an example embodiment of the inventive concept. As illustrated, the computer system 3000 includes a network adapter 3100 electrically connected to a system bus 3700, a central processing unit (CPU) 3200, a data storage device 3300, a random access memory (RAM) 3400, a read only memory (ROM), and a user interface 3600. The CPU includes a static random access memory device 3250 according to an embodiment of the inventive concept.

The network adapter 3100 provides interfacing between the computer system 3000 and external networks. The CPU 3200 performs overall operation processing for driving an operating system (OS) or application programs that are resident on the RAM 3400. The CPU 3200 may use the static random access memory device 3250 as a cache memory to perform the operation processing. The static random access memory device 3250 may stably control a memory cell array voltage and a bitline voltage through write and read assist circuits. Thus, the static random access memory device 3250 may stably perform write and read operations.

The data storage device 3300 stores overall data required in the computer system 3000. For example, an operating system (OS) for driving the computing system 3000, application programs, various types of program modules, program data, and user data are stored in the computer system 3000. The RAM 3400 may be used as a working memory of a computer system 3000. Not only the operating system (OS), the application programs, the various types of program modules read from the data storage device 3300 but also program data consumed to drive programs is loaded into the RAM 3400 at the time of booting. A basic input/output system (BIOS) activated before driving the operating system (OS) at the time of booting is stored in the ROM 3500. Information exchange between the computer system 3000 and a user is conducted through the user interface 3600. Besides, the computer system 3000 may further include a battery or a modem. Although not shown in the figure, it will be understood that a computer system according to the inventive concept may be further provided with an application chipset, a camera image processor (CIS), a mobile DRAM, and so forth.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An integrated circuit memory device, comprising:
   a memory cell configured to receive a power supply signal on a power supply signal line;
   a write assist circuit electrically coupled to the power supply signal line, said write assist circuit configured to reduce a magnitude of the power supply signal supplied to said memory cell from a first voltage level to a lower second voltage level during an operation to write data into said memory cell; and
   a read assist circuit electrically coupled to said memory cell by at least one bit line, said read assist circuit configured to partially discharge the at least one bit line from a precharged voltage level established during a precharge time interval to a lower third voltage level in preparation to read data from said memory cell during a read time interval.

2. The memory device of claim 1, wherein said write assist circuit is further configured to raise the power supply signal from the second voltage level to the first voltage level upon completion of the operation to write data into said memory cell.

3. The memory device of claim 1, wherein the memory cell is a static random access memory cell comprising a pair of PMOS transistors; and wherein source terminals of the pair of PMOS transistors are configured to receive the power supply signal.

4. The memory device of claim 3, wherein said memory cell is responsive to an active word line signal during the operation to write data into said memory cell; and wherein said write assist circuit is configured to hold the magnitude of the power supply signal at the second voltage level when the word line signal is active during the operation to write data into said memory cell.

5. The memory device of claim 4, wherein said write assist circuit is configured to pull down the magnitude of the power supply signal from the first voltage level to the second voltage level when the word line signal is switched from a logic 0 voltage level to a logic 1 voltage level upon commencement of the operation to write data into said memory cell.

6. An integrated circuit memory device, comprising:
   a memory cell configured to receive a power supply signal;
   a write assist circuit electrically coupled to said memory cell, said write assist circuit configured to reduce a magnitude of the power supply signal supplied to said memory cell from a first voltage level to a lower second voltage level during an operation to write data into said memory cell;
   at least one bit line electrically coupled to said memory cell; and
   a read assist circuit electrically coupled to said at least one bit line, said read assist circuit configured to partially discharge the at least one bit line from a precharged voltage level to a lower third voltage level in preparation to read data from said memory cell.

7. The memory device of claim 6, wherein said write assist circuit is further configured to raise the power supply signal from the second voltage level to the first voltage level upon completion of the operation to write data into said memory cell.

8. The memory device of claim 6, wherein said read assist circuit is responsive to a read assist control signal; and wherein said read assist circuit is configured to partially discharge the at least one bit line in response to a transition of the read assist control signal between unequal logic states.

9. An integrated circuit memory device, comprising:
a static random access memory (SRAM) cell electrically coupled to a word line and a pair of complementary bit lines, said SRAM cell comprising a pair of PMOS pull-up transistors and a pair of NMOS pull-down transistors; and
a read assist circuit electrically coupled to said pair of complementary bit lines, said read assist circuit configured to partially discharge the pair of complementary bit lines from a precharged voltage level established during a precharge time interval to a reduced precharged voltage level in advance of reading data from said SRAM cell during a read time interval.

10. The memory device of claim 9, wherein the read time interval follows the precharge time interval by an intervening time interval during which the pair of complementary bit lines are continuously maintained at the reduced precharged voltage level.

11. The memory device of claim 9, further comprising:
a write assist circuit electrically coupled to source terminals of the pair of PMOS pull-up transistors by a power supply line, said write assist circuit configured to reduce a magnitude of a voltage on the power supply line from a first voltage level to a lower second voltage level during an operation to write data into said SRAM cell.

12. The memory device of claim 11, wherein said write assist circuit comprises a MOS transistor having a first current carrying terminal electrically connected to the power supply line and a second current carrying terminal responsive to a write assist control signal.

13. The memory device of claim 11, wherein said write assist circuit comprises a PMOS transistor having a drain terminal electrically connected to the power supply line and a source terminal responsive to a write assist control signal.

14. The memory device of claim 13, wherein the write assist control signal is held at a voltage below the second voltage level during the operation to write data into said SRAM cell.

15. The memory device of claim 14, wherein a gate terminal of the PMOS transistor in the write assist circuit is held at a fixed voltage during the operation to write data into said SRAM cell.

16. The memory device of claim 9, wherein said read assist circuit comprises a pair of PMOS transistors having commonly connected gate terminals and commonly connected source terminals.

17. The memory device of claim 16, wherein the commonly connected source terminals are responsive to a read assist control signal.

18. The memory device of claim 17, wherein each of the pair of PMOS transistors within said read assist circuit has a drain terminal electrically connected to a respective one of the pair of complementary bit lines.

19. A static random access memory device comprising:
a memory cell;
a precharge circuit configured to precharge a power supply terminal of the memory cell or a bitline connected to the memory cell;
an assist circuit electrically coupled to the power supply terminal and said bitline, said a write assist circuit configured to discharge or precharge the power supply terminal precharged by the precharge circuit according to a write assist control signal and the bitline precharged by the precharge circuit according to a read assist control signal; and
a control logic configured to generate the write assist control signal such that the power supply terminal is discharged during a write operation and precharged during a read operation or a standby operation and the read assist control signal such that the bitline is discharged during the read operation and precharged during the write operation or the standby operation;
wherein the precharge circuit includes a first PMOS transistor configured to transfer a power supply voltage to the bitline; and the assist circuit includes a second PMOS transistor configured to discharge or precharge the bitline.

20. The static random access memory device of claim 19, wherein:
the bitline is discharged when a gate of the second PMOS transistor is grounded and the read assist control signal of logic low level is applied to one end of the second PMOS transistor.

21. The static random access memory device of claim 20, wherein:
a voltage of the discharged bitline is maintained below a voltage precharged by each of the first and second PMOS transistors.

22. The static random access memory device of claim 19, wherein:
the second PMOS transistor discharges or precharges the bitline according to the read assist control signal applied to a gate of the second PMOS transistor.

* * * * *